(12) United States Patent
Chambers et al.

(10) Patent No.: US 7,612,422 B2
(45) Date of Patent: Nov. 3, 2009

(54) STRUCTURE FOR DUAL WORK FUNCTION METAL GATE ELECTRODES BY CONTROL OF INTERFACE DIPOLES

(75) Inventors: James Joseph Chambers, Dallas, TX (US); Luigi Colombo, Dallas, TX (US); Mark Robert Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 69 days.

(21) Appl. No.: 11/618,650

(22) Filed: Dec. 29, 2006

(65) Prior Publication Data
US 2008/0157228 A1 Jul. 3, 2008

(51) Int. Cl.
*H01L 31/119* (2006.01)
(52) U.S. Cl. ............... 257/407; 257/371; 257/372; 257/E21.63; 257/E21.625
(58) Field of Classification Search ............... 257/400, 257/327, 371–372, 315, 407, E21.625; 438/197–199
See application file for complete search history.

(56) References Cited

U.S. PATENT DOCUMENTS

| 6,274,467 | B1 | 8/2001 | Gambino et al. |
| 6,936,508 | B2 | 8/2005 | Visokay et al. |
| 2006/0115940 | A1 | 6/2006 | Kim et al. |
| 2006/0289953 | A1 | 12/2006 | Sakuma et al. |
| 2007/0272975 | A1* | 11/2007 | Schaeffer et al. ............ 257/327 |
| 2008/0176368 | A1* | 7/2008 | Ichihara et al. ............. 438/216 |

\* cited by examiner

*Primary Examiner*—Dung A. Le
(74) *Attorney, Agent, or Firm*—Warren L. Franz; Wade J. Brady, III; Frederick J. Telecky, Jr.

(57) ABSTRACT

Exemplary embodiments provide structures for dual work function metal gate electrodes. The work function value of a metal gate electrode can be increased and/or decreased by disposing various electronegative species and/or electropositive species at the metal/dielectric interface to control interface dipoles. In an exemplary embodiment, various electronegative species can be disposed at the metal/dielectric interface to increase the work function value of the metal, which can be used for a PMOS metal gate electrode in a dual work function gated device. Various electropositive species can be disposed at the metal/dielectric interface to decrease the work function value of the metal, which can be used for an NMOS metal gate electrode in the dual work function gated device.

17 Claims, 7 Drawing Sheets

STRUCTURE FOR DUAL WORK FUNCTION METAL GATE ELECTRODES BY CONTROL OF INTERFACE DIPOLES

DESCRIPTION OF THE INVENTION

1. Field of the Invention

This invention relates generally to semiconductor devices and fabrication processes and, more particularly, to complementary transistors having dual work function metal gate electrodes and methods for their fabrication.

2. Background of the Invention

Electrical active devices such as complementary transistors require low threshold voltages ($V_t$) for high device performance. Generally, metal gate electrodes are used to reduce gate depletion and meet the high performance goals, for example, for the 45 nm node. A conventional solution to obtain low $V_t$ is to use dual work function metal gate electrodes. Problems arise, however, because integration of dual work function metal gate electrodes has proven to be a difficult task. For example, one difficult aspect of dual work function metal gate integration is the control of the work function, especially when the metal gates are subjected to a high temperature anneal. High temperature annealing of metals that form the gates tends to shift the work function towards the mid-gap due to the formation of dipoles at the metal/dielectric interface. Currently, there is no solution in the prior art to control the work function of metal gate electrodes by controlling the dipoles.

Thus, there is a need to overcome these and other problems of the prior art and to provide structures and methods to control the work function of metal gate electrodes by engineering and/or controlling the interface dipoles.

SUMMARY OF THE INVENTION

According to various embodiments, the present teachings include a semiconductor device. The semiconductor device can include a dielectric material disposed over a semiconductor substrate. The semiconductor device can also include a first metal gate electrode disposed on the dielectric material having a first interface therebetween. At the first interface, a first plurality of interface dipoles can be formed to provide the first metal gate electrode with an increased work function value. The semiconductor device can further include a second metal gate electrode disposed on the dielectric material having a second interface therebetween. At the second interface, a second plurality of interface dipoles can be formed to provide the second metal gate electrode with a decreased work function value.

According to various embodiments, the present teachings also include a method for forming a semiconductor device. In the method, a metal layer can be formed on a dielectric material, which can be disposed over a semiconductor substrate. A first portion of the metal layer can then be converted to a first gate material having a plurality of electronegative species disposed at a first interface between the first gate material and the dielectric material. A second portion of the metal layer can also be converted to a second gate material having a plurality of electropositive species disposed at a second interface between the second gate material and the dielectric material.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate one (several) embodiment(s) of the invention and together with the description, serve to explain the principles of the invention.

DESCRIPTION OF THE EMBODIMENTS

Figure 1:
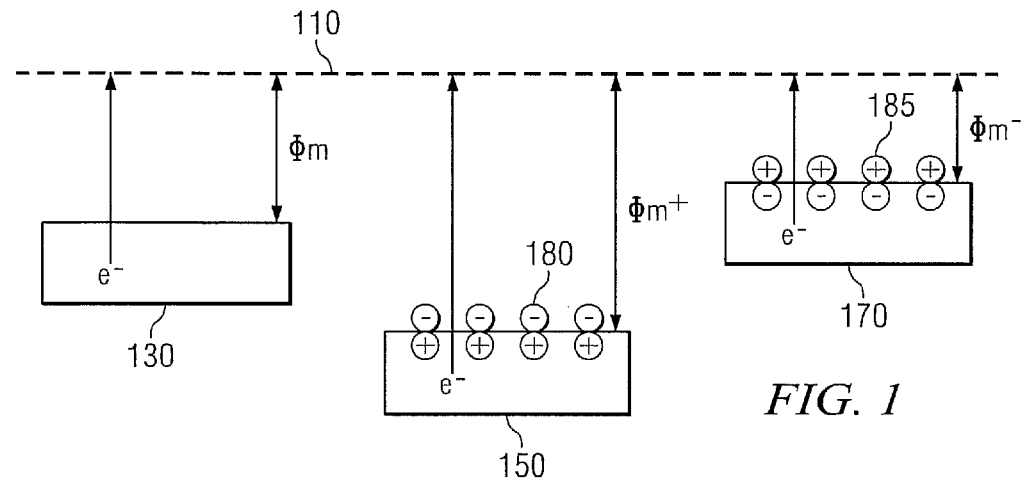
FIG. 1 depicts an energy band diagram which explains how the interface dipoles control the effective work function value of metal surfaces in accordance with the present teachings.

Reference will now be made in detail to the present embodiments (exemplary embodiments) of the invention, an example of which is illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Exemplary embodiments provide structures and methods for dual work function metal gate electrodes for applications such as complementary transistors. Specifically, the work function value of a metal gate electrode can be controlled by forming various dipoles (also referred to herein as "interface dipoles") and by further controlling the polarity direction of the various dipoles at the interface between the metal gate electrode and the underlying dielectric material. In this manner, the work function value of the metal gate electrode can be increased or decreased. In various embodiments, the interface dipoles can in turn be controlled by disposing one or more of electronegative species and electropositive species at the metal/dielectric interface.

The metal gate electrode can include one or more conductive materials (also referred to herein as "metals"), from which a competent metal gate electrode can be formed, such as, for example, single metals, metal compounds, metal alloys, metal nitrides, metal silicides, metal oxide and all possible combinations. Exemplary metals can include, but are not limited to, Ti, Al, Ta, W, Ir, Mo, Ru, Pt, Ni, Hf, TiTa, RuTa, $TiSi_2$, WN, WCON, WAlN, WSiN TaN, TaAlN, TaCON, NiSi, $WSi_2$, TiN, $CoSi_2$, $MoSi_2$, ZrN, WSi, HfN, $IrO_2$, PtTa, TaCN, MoN, $RuO_2$, TiAlN, TiSiN, TaSiN, TiTaN, RuTaN, PtTaN, WSiN, MoSiN, ZrSiN, HfSi, and ZrSi.

The dielectric material can include one or more materials selected from the group consisting of silicon oxide ($SiO_2$), silicon nitride ($Si_3N_4$), silicon oxynitride (SiON), fluorinated silicon dioxide (SiOF), silicon oxycarbide (SiOC), hafnium oxide ($HfO_2$), hafnium-silicate (HfSiO), nitride hafnium-silicate (HfSiON), zirconium oxide ($ZrO_2$), aluminum oxide ($Al_2O_3$), barium strontium titanate (BST), lead zirconate titanate (PZT), zirconium silicate ($ZrSiO_2$), zirconium silicon oxynitride (ZrSiON), hafnium lanthanum oxynitride (HfLaON), hafnium aluminum oxynitride (HfAlON), and tantalum oxide ($TaO_2$).

FIG. 1 depicts an energy band diagram which explains how various interface dipoles increase and/or decrease the effective work function value of a metal in accordance with the present teachings. As shown, FIG. 1 includes a metal 130 having no interface dipoles, a first metal material 150 having the same metal as the metal 130 with a first plurality of interface dipoles 180 at the surface of the metal, and a second metal material 170 having the same metal as the metal 130 with a second plurality of interface dipoles 185 at the surface of the metal. As shown, the polarity directions for the first plurality of interface dipoles 180 can be opposite to that of the second plurality of interface dipoles 185.

For the metal 130, the work function values ("$\phi_m$") can be determined by the energy necessary to emit the electrons ("$e^-$") at a conduction band level from the metal 130 into a vacuum. The vacuum level at line 110 can be at a higher position than the conduction band level of the metal 130.

For the first metal material 150, when the first plurality of interface dipoles 180 exist and point into the surface, i.e., with positive charges in the metal, the electron ("$e^-$") emitted from the metal surface can be decelerated by the dipoles as the electron moves into vacuum, thereby increasing the work function ("$\phi_m+$") of the metal.

For the second metal material 170, when the second plurality of interface dipoles 185 exist and point out of the surface, i.e., with negative charges in the metal, the electron ("$e^-$") emitted from the surface can be accelerated by the dipoles as the electron moves into vacuum, thereby decreasing the work function ("$\phi_m-$") of the metal.

Therefore, the polarity directions of the interface dipoles (i.e., either pointing into or out of the metal) can be used to increase and/or decrease the work function value of the metal, respectively. In various embodiments, the interface dipoles can in turn be controlled by selectively disposing various electronegative and/or electropositive species at the metal surface. For example, various electronegative species can be disposed at the interface of a metal gate electrode and a dielectric material to provide increased work function values of, for example, about 4.8 to 5.4 eV, which can be used for PMOS transistors in dual work function gated devices. In another example, various electropositive species can be disposed at the interface of a metal gate electrode and a dielectric material to provide decreased work function values of, for example, about 3.8 to 4.4 eV, which can be used for NMOS transistors in the dual work function gated devices.

Exemplary electronegative species can include, but are not limited to, C, N, O, F, S, Cl, Se, Br, Kr, I, and Xe, while exemplary electropositive species can include, but are not limited to, Cs, Ba, Rb, Sr, Mg, Li, Be, Yb, and Gd.

In various embodiments, the disclosed dual work function gated devices can be formed with a first work function value such as for PMOS gate electrodes and a second work function value such as for NMOS gate electrodes, wherein the first work function value is greater than the second work function value. Each of the PMOS gate electrodes and the NMOS gate electrodes can be formed by adding one or more suitable species selected from the group consisting of electropositive species and electronegative species.

FIGS. 2A-2H, FIGS. 3A-3F, and FIGS. 4A-4F depict various exemplary structures and methods for fabricating exemplary dual work function gated devices having transistor gates that possess differing work function values. In various embodiments, the differing work function values can be controlled by forming a plurality of interface dipoles by adding various electronegative species to form PMOS gate materials and adding various electropositive species to form NMOS gate materials. In various embodiments, an NMOS gate material can be formed following a formation of a PMOS gate material, and vice versa. In some embodiments, interface dipoles can be formed at the surface of the dielectric material before forming the metal on the dielectric material. In other embodiments, interface dipoles can be formed at the surface of the dielectric material after gate etch of the metal gate electrodes.

FIGS. 2A-2H depict cross-sectional views of an exemplary dual work function gated transistor device 200 at various stages of fabrication in accordance with the present teachings. It should be readily apparent to one of ordinary skill in the art that the transistor device 200 depicted in FIGS. 2A-2H represents a generalized schematic illustration and that other regions/layers/species can be added or existing regions/layers/species can be removed or modified.

Figure 2A:
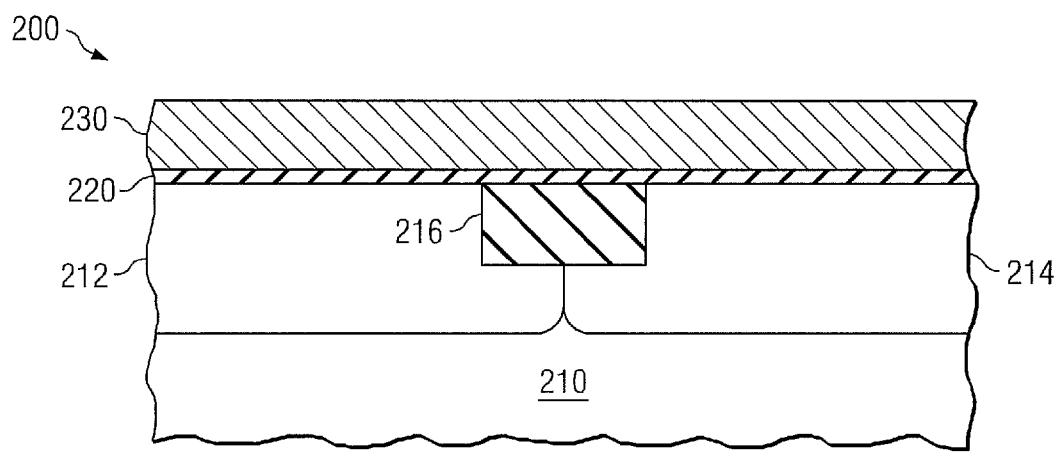
FIGS. 2A-2H depict cross-sectional views of a first exemplary dual work function gated device at various stages of fabrication in accordance with the present teachings.

In FIG. 2A, the device 200 can include a silicon substrate 210, a dielectric material 220 and a metal layer 230. The metal layer 230 can be disposed on the dielectric material 220, which can be disposed over the silicon substrate 210.

The silicon substrate 210 can be conductively doped to form a PMOS region 212 and an NMOS region 214 with an isolation region 216 separating the doped regions 212 and 214. The dielectric material 220 can be formed of any dielectric material as described above. The metal layer 230 can be formed of any conductive material (i.e., metal) from which a competent metal gate electrode can be formed.

Figure 2B:
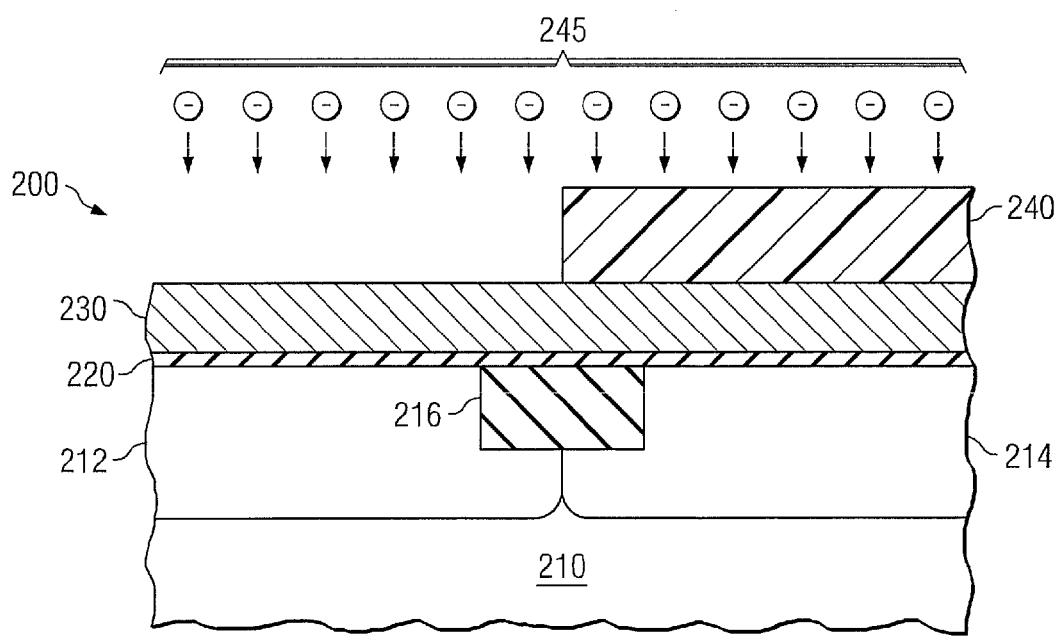

In FIG. 2B, a mask pattern 240, such as a photoresist pattern, can be formed on the metal layer 230 to expose a first selected portion of the metal layer 230, which is over the PMOS region 212. At 245, with an appropriate mask pattern such as the mask pattern 240 in place, the first selected portion of the metal layer 230 can be implanted with various electronegative species using techniques known to one of ordinary skill in the art, for example, a standard ion implantation process.

Figure 2C:
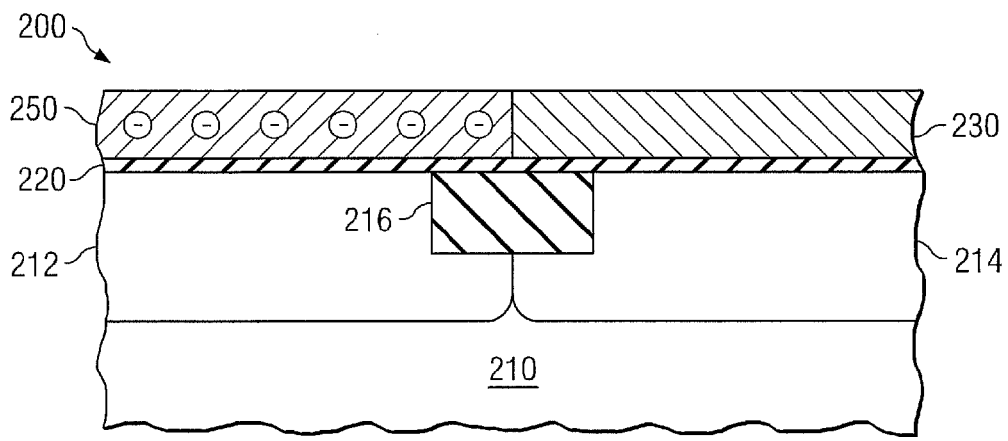

In FIG. 2C, a PMOS gate material 250, defined by the first selected portion of the metal layer 230 implanted with a plurality of electronegative species, can be formed on the dielectric material 220 associated with the PMOS region 212. Thereafter, the mask pattern 240 can be removed.

Figure 2D:
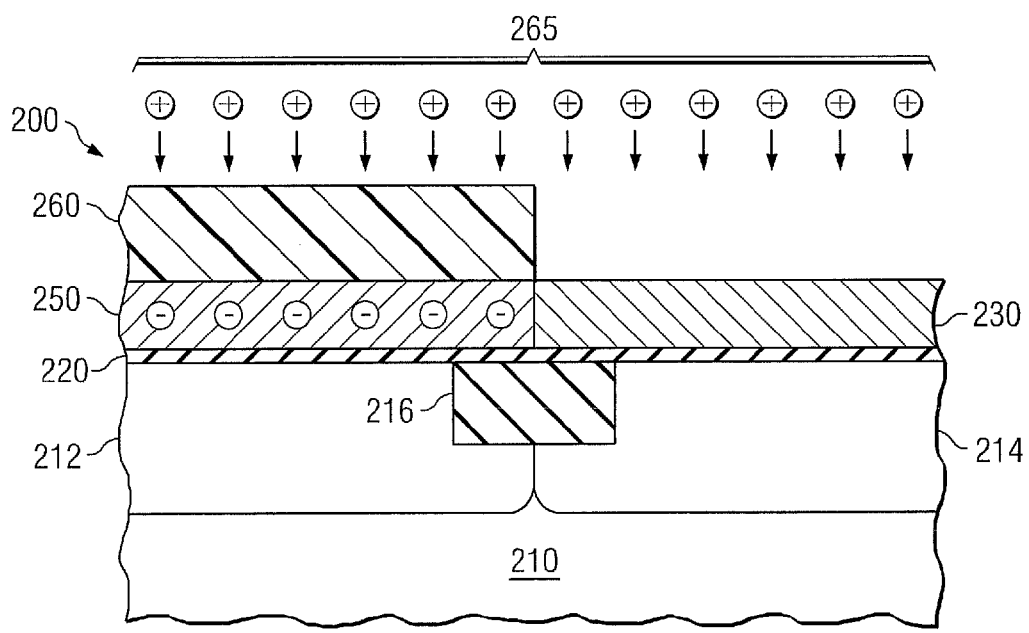

In FIG. 2D, a second mask pattern 260, such as a photoresist pattern, can be formed on the PMOS gate material 250 to expose a second selected portion of the metal layer 230 overlaying the NMOS region 214.

In various embodiments, the metal used for PMOS and NMOS gate materials can be different. For example, the second selected portion of the metal layer 230 in FIG. 2D can be removed by suitable etching processes and a second metal can be deposited over the dielectric material 220 associated with the NMOS region 214.

At 265, with the mask pattern 260 in place, the second selected portion of the metal layer 230 (or the second metal) can be implanted with electropositive species using, for example, a standard ion implantation process.

Figure 2E:
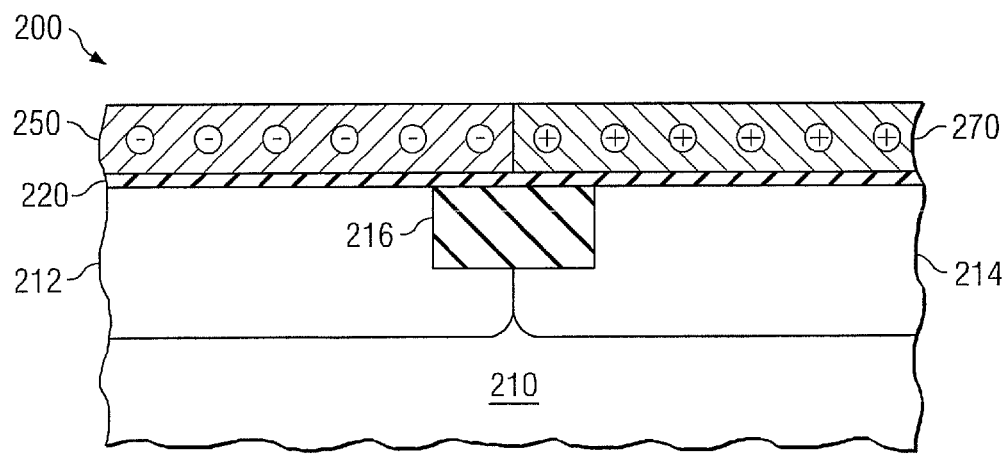

In FIG. 2E, an NMOS gate material 270, defined by the second selected portion of the metal layer 230 implanted with a plurality of electropositive species, can be formed over the dielectric material 220. Thereafter, the mask pattern 260 can be removed. In this manner, the metal layer 230 can be converted into the PMOS gate material 250 including the implanted plurality of electronegative species and the NMOS gate material 270 including the implanted plurality of electropositive species, wherein the PMOS gate material 250 and the NMOS gate material 270 can be adjacent to one another.

Figure 2F:
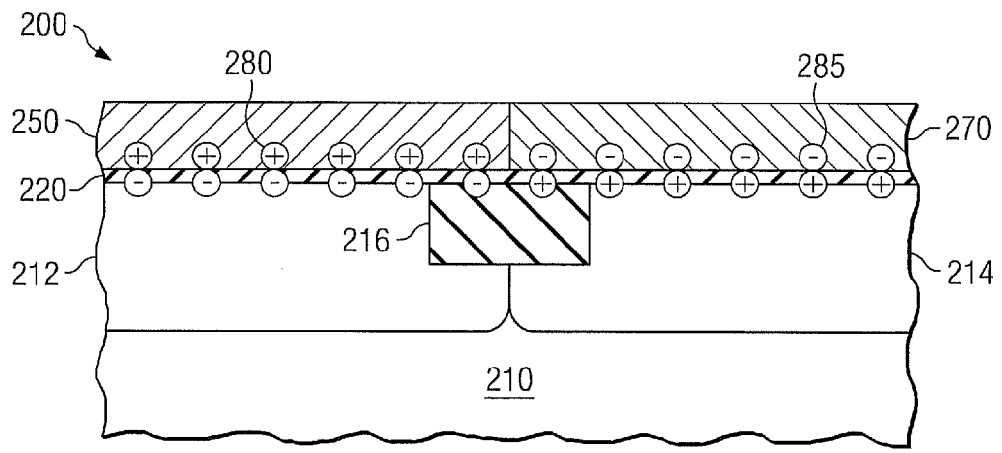

In FIG. 2F, the plurality of electronegative species in the PMOS gate material 250 can be driven to a first interface between the PMOS gate material 250 and the dielectric material 220 using, for example, an annealing process known to one of ordinary skill in the art. Meanwhile, the plurality of electropositive species in the NMOS gate material 270 can be driven to a second interface between the NMOS gate material 270 and the dielectric material 220.

As a result, the device 200 can include a first plurality of interface dipoles 280 formed at the first interface pointing into the PMOS gate material 250 to provide an increased work function value. The device 200 can also include a second plurality of interface dipoles 285 formed at the second interface pointing out of the NMOS gate material 270 to provide a decreased work function value.

In various embodiments, the converted metal layer 230, including the PMOS gate material 250 and the NMOS gate material 270, can be a mid-gap film formed on the dielectric material 220. In this case, a conductive material (not shown) such as a heavily doped film, for example, a polysilicon, can then be formed over the mid-gap film to form composite gate materials. Furthermore, depending upon the specific metal used for the metal layer 230, a diffusion barrier material can be inserted between the heavily doped film and the metal layer 230 to prevent reaction between metal layer 230 and the heavily doped film. Exemplary diffusion barrier materials can include, but are not limited to, TiN, TaN, or WN.

Figure 2G:
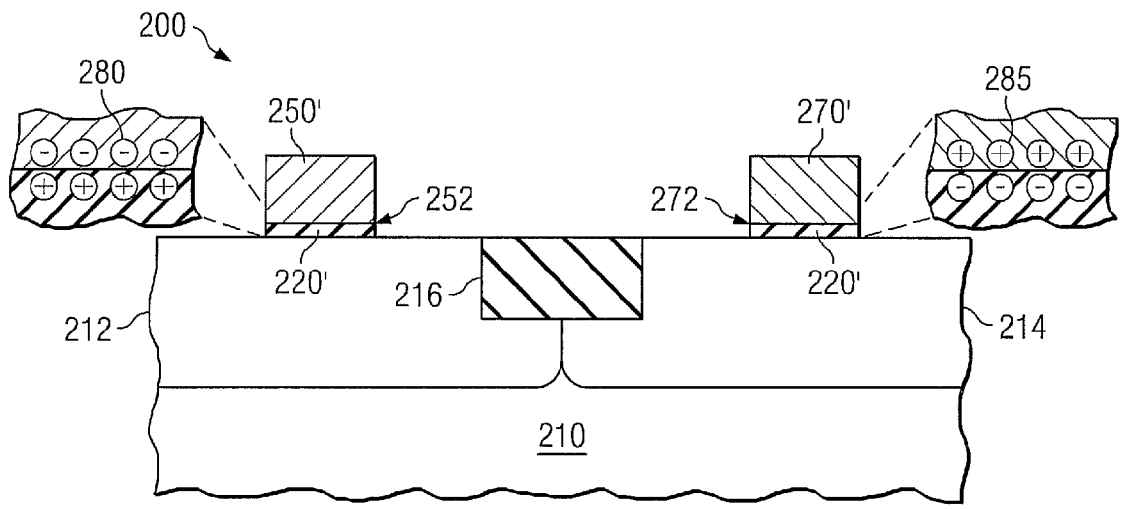

In FIG. 2G, using conventional methods, the PMOS gate material 250 along with the dielectric material 220 can be patterned to form a PMOS stacked structure including a PMOS gate electrode 250' overlaid on a patterned portion of the dielectric material 220' having a first interface 252. The first plurality of interface dipoles 280 pointing into the gate electrode 250' can be located at the first interface 252. Likewise, the NMOS gate material 270 along with the dielectric material 220 can be patterned to form an NMOS stacked structure including an NMOS gate electrode 270' overlaid on a patterned portion of the dielectric material 220' having a second interface 272. The second plurality of interface dipoles 285 pointing out of the NMOS gate electrode 270' can be located at the second interface 272.

Figure 2H:
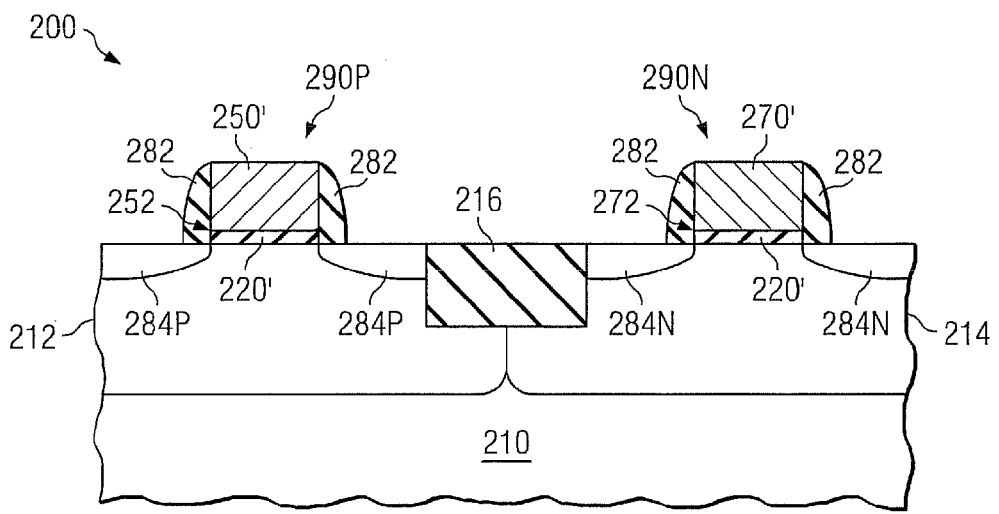

In FIG. 2H, completed PMOS and NMOS gate electrode structures 290P and 290N can be formed having transistor gates that possess differing work function values. Specifically, gate spacers 282 can be formed along the sidewalls of the PMOS and NMOS stacked structures. Following the formation of the NMOS and PMOS gate electrode structures, respective source and drain regions 284N and 284P can be formed in the silicon substrate 210, respectively. Even further, respective source and drain regions 284N and 284P can be formed in the doped regions 214 and 212 of the silicon substrate 210.

In various embodiments, metals used for the PMOS and NMOS gate electrodes can be different and with desired electronegative and/or electropositive species. FIGS. 3A-3F depict cross-sectional views of a second exemplary dual work function gated transistor device 300 at various stages of fabrication in accordance with the present teachings. It should be readily apparent to one of ordinary skill in the art that the transistor device 300 depicted in FIGS. 3A-3F represents a generalized schematic illustration and that other regions/layers/species can be added or existing regions/layers/species can be removed or modified.

Figure 3A:
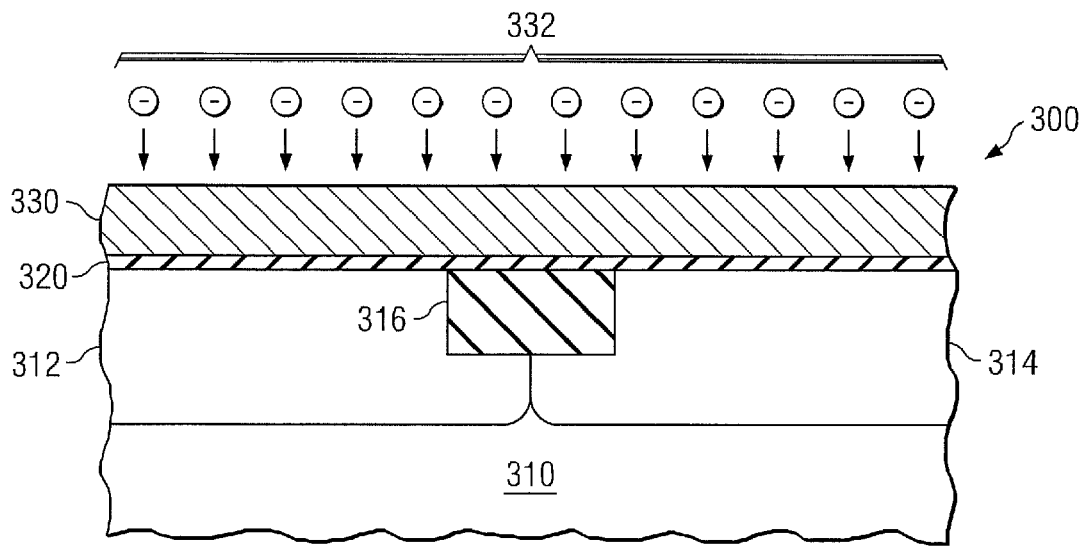
FIGS. 3A-3F depict cross-sectional views of a second exemplary dual work function gated device at various stages of fabrication in accordance with the present teachings.

In FIG. 3A, the device 300 can include a similar structure as shown in FIG. 2A including a metal layer 330 disposed over a dielectric material 320, which can be disposed over a silicon substrate 310. The silicon substrate 310 can be conductively doped for a PMOS region 312 and an NMOS region 314 with an isolation region 316 separating the two doped regions. At 332, an exemplary ion implantation process can be performed to add various electronegative species into the metal layer 330.

Figure 3B:
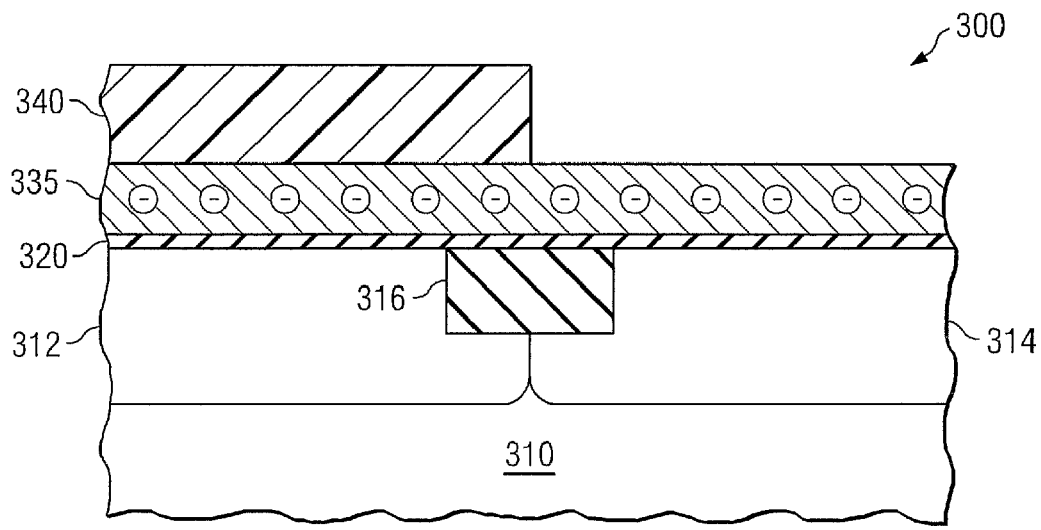

In FIG. 3B, a metal gate material 335, defined by the metal layer 330 having the implanted electronegative species from 332, can be formed over the dielectric material 320. A mask pattern 340, such as a photoresist pattern, can then be formed on the metal gate material 335 to expose a first selected portion of the metal gate material 335 associated with the NMOS region 314.

Figure 3C:
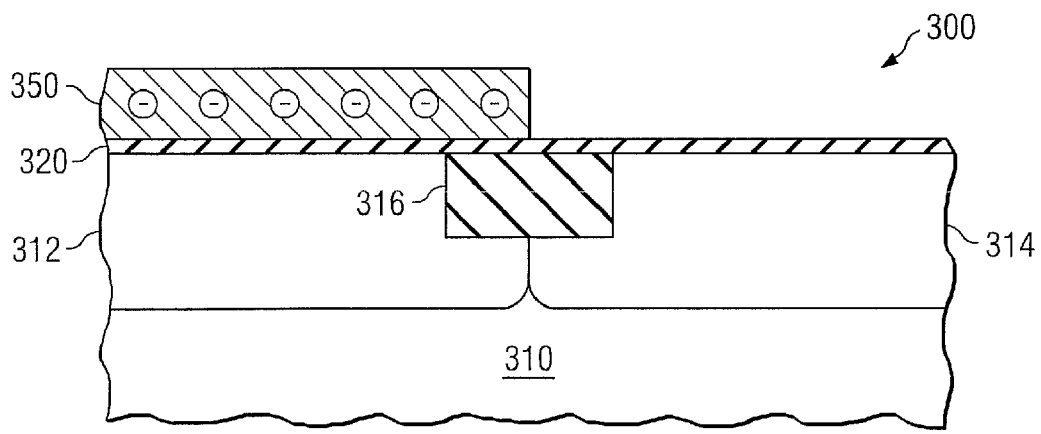

In FIG. 3C, a PMOS gate material 350, defined by a portion of the metal gate material 335 implanted with a plurality of electronegative species, can be formed by removing the first selected portion of the metal gate material 335 using suitable etching processes and exposing a surface of the dielectric material 320, which can be over the NMOS region 314.

Figure 3D:
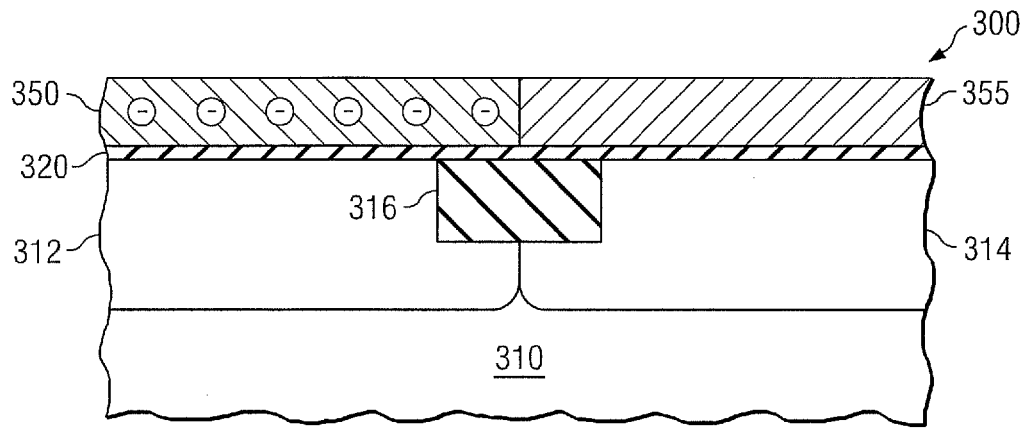

In FIG. 3D, a second metal 355 can be deposited on the exposed surface of the dielectric material 320 over the NMOS region 314. In various embodiments, the second metal 355 can be formed by first depositing the second metal material on the surface of the device 300, that is, on both the surface of the PMOS gate material 350 and the exposed dielectric material 320, followed by an etch process to remove a portion of the deposited second metal material on the surface of the PMOS gate material 350 using a suitable photolithographic technique known to one of ordinary skill in the art.

Figure 3E:
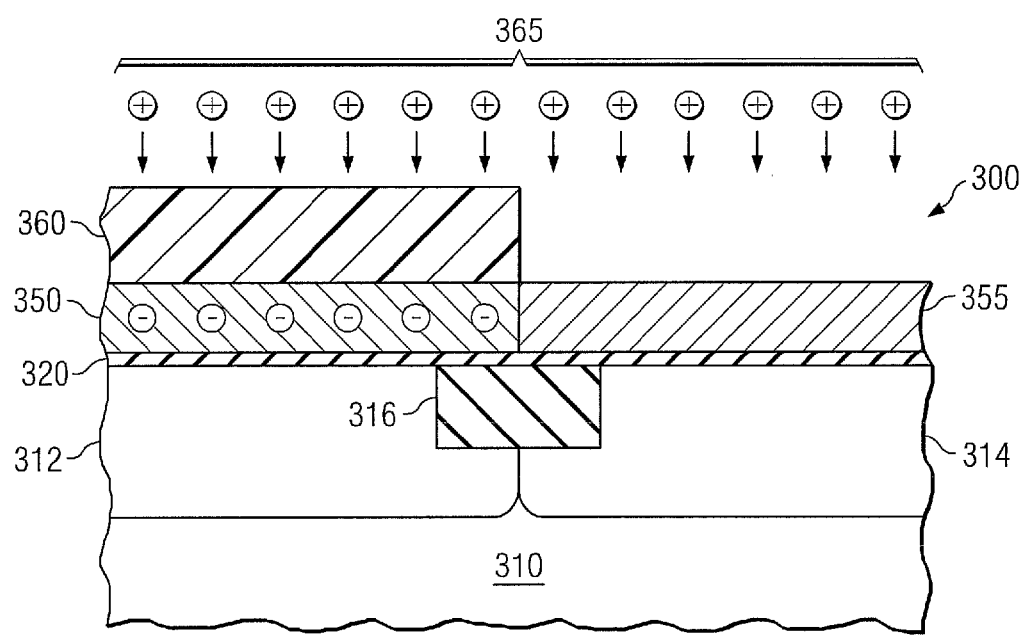

In FIG. 3E, at 365, the second metal 355 can be implanted with various electropositive species by, for example, an ion implantation process, using a suitable mask pattern 360. As shown, the device 300 in FIG. 3D has a similar structure to that shown in FIG. 2D.

Figure 3F:
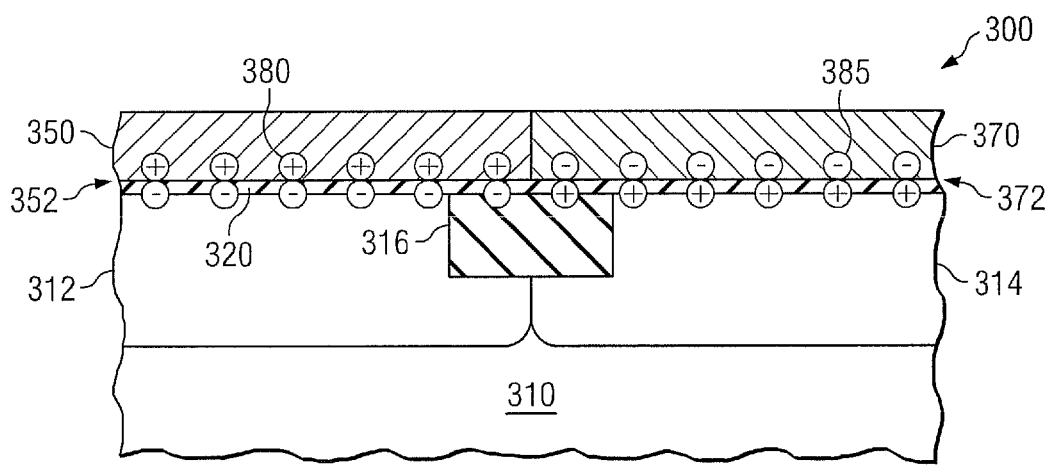

In FIG. 3F, an NMOS gate material 370, defined by the second metal 355 implanted with a plurality of electropositive species, can be formed from the ion implantation process at 365, which can be followed by, for example, an annealing process of the device to form pluralities of interface dipoles between the gate materials and the dielectric material 320. Specifically, a first plurality of interface dipoles 380 and a second plurality of interface dipoles 385 can be formed at respective interface 352 and 372, providing the PMOS gate material 350 an increased work function value and providing the NMOS gate material 370 a decreased work function value.

Conventional processes can then be used to pattern and etch the device 300 shown in FIG. 3F to complete the fabrication process of the PMOS and NMOS transistors as similarly described in FIGS. 2G-2H.

In various embodiments, various electronegative and/or electropositive species can be added to form metal gate materials by alternative techniques, for example, a solid state diffusion process, using a cladding layer over the metal layer. FIGS. 4A-4F depict cross-sectional views of a third exemplary dual work function gated transistor device 400 at various stages of fabrication in accordance with the present teachings. It should be readily apparent to one of ordinary skill in the art that the transistor device 400 depicted in FIGS. 4A-4F represents a generalized schematic illustration and that other regions/layers/species can be added or existing regions/layers/species can be removed or modified.

Figure 4A:
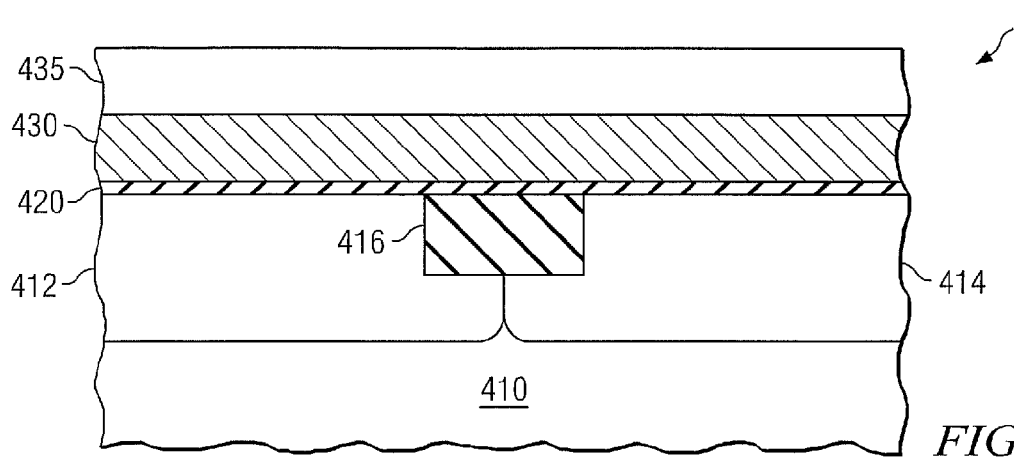
FIGS. 4A-4F depict cross-sectional views of a third exemplary dual work function gated device at various stages of fabrication in accordance with the present teachings.

In FIG. 4A, the device 400 can include a cladding layer 435 formed over a structure similar to that shown in FIG. 2A. Specifically, the cladding layer 435 can be formed over a metal layer 430, which can be disposed over a dielectric material 420 overlaying a silicon substrate 410. The silicon substrate 410 can be conductively doped for a PMOS region 412 and an NMOS region 414 with an isolation region 416 separating the two doped regions.

The cladding layer 435 can be used to facilitate the solid state diffusion of desired electronegative and/or electropositive species into the metal layer 430 to form metal gate materials. In various embodiments, the cladding layer 435 can be formed of, for example, a polysilicon.

Figure 4B:
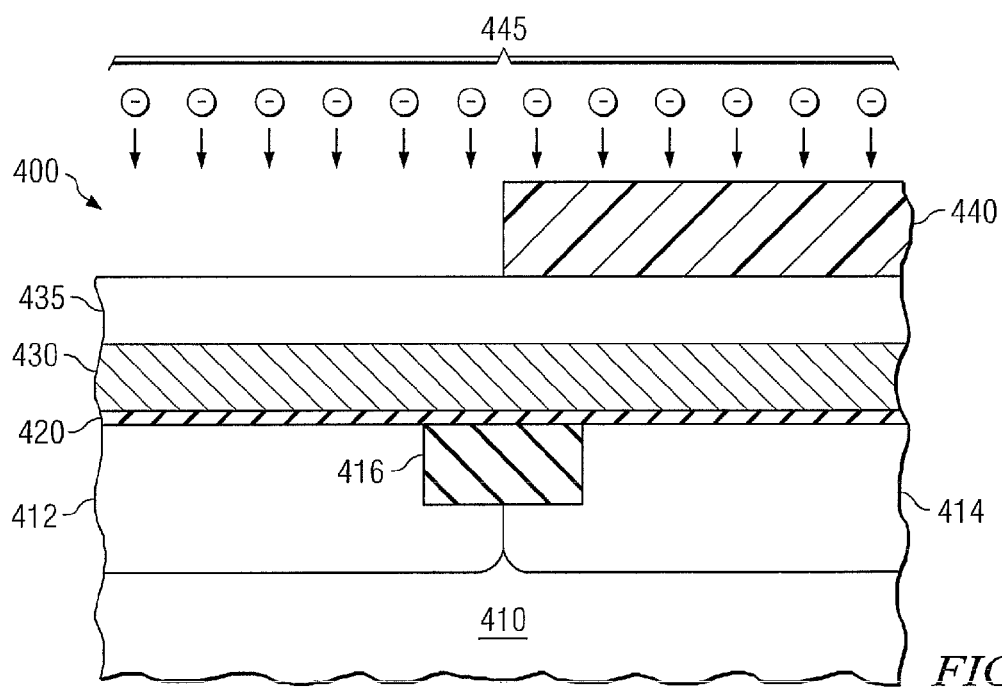

In FIG. 4B, a mask pattern 440, such as a photoresist pattern, can be formed on the cladding layer 435 to expose a first selected portion of the cladding layer 435, which can be associated with the PMOS region 412. At 445, using suitable mask pattern such as the mask pattern 440, various electronegative species can be added (e.g., implanted) into the first selected portion of the cladding layer 435 using techniques known to one of ordinary skill in the art.

Figure 4C:
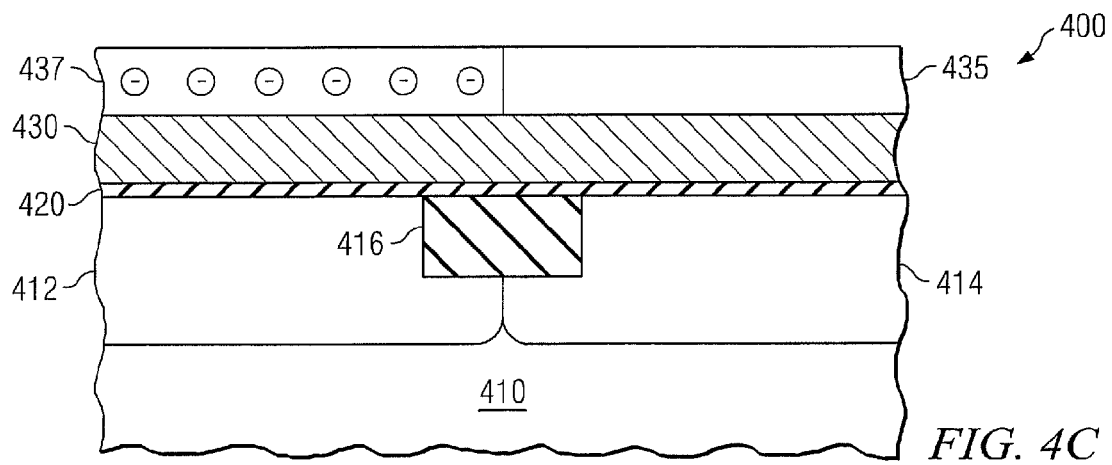

In FIG. 4C, the first selected portion 437 of the cladding layer 435 can include the added electronegative species followed by a removal of the mask pattern 440.

Figure 4D:
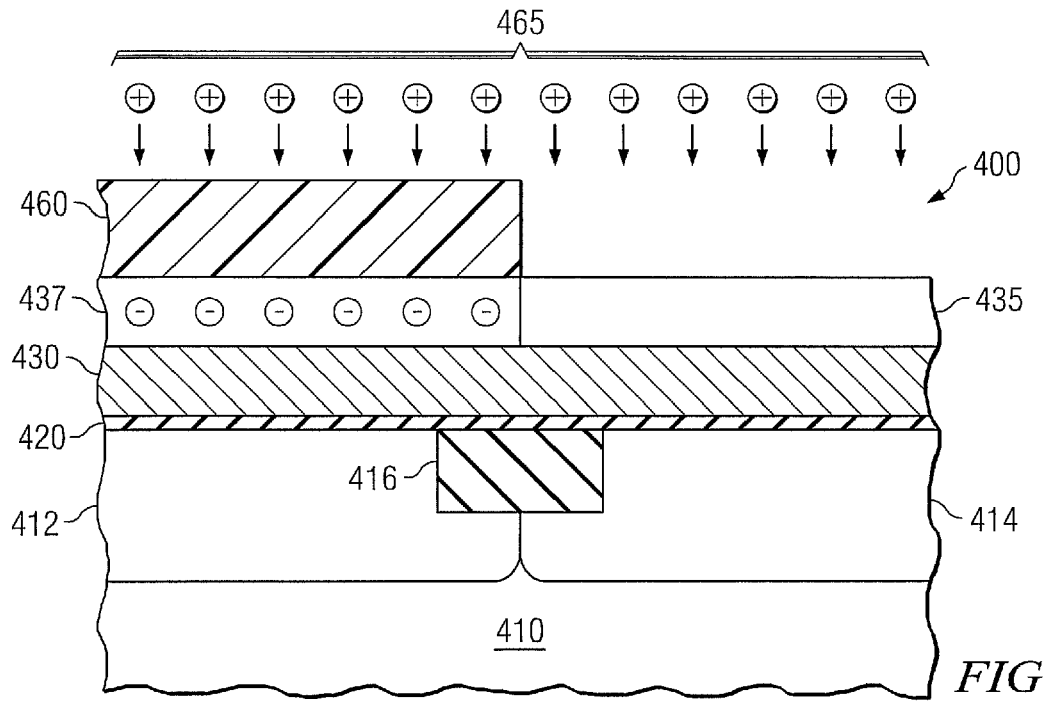

In FIG. 4D, a second mask pattern 460, such as a photoresist pattern, can be formed on the first selected portion 437 of the cladding layer 435 to expose a second selected portion of the cladding layer 435, which can be associated with the NMOS region 414. At 465, various electropositive species can be added (e.g., implanted) into the second selected portion of the cladding layer 435 using techniques known to one of ordinary skill in the art.

Figure 4E:
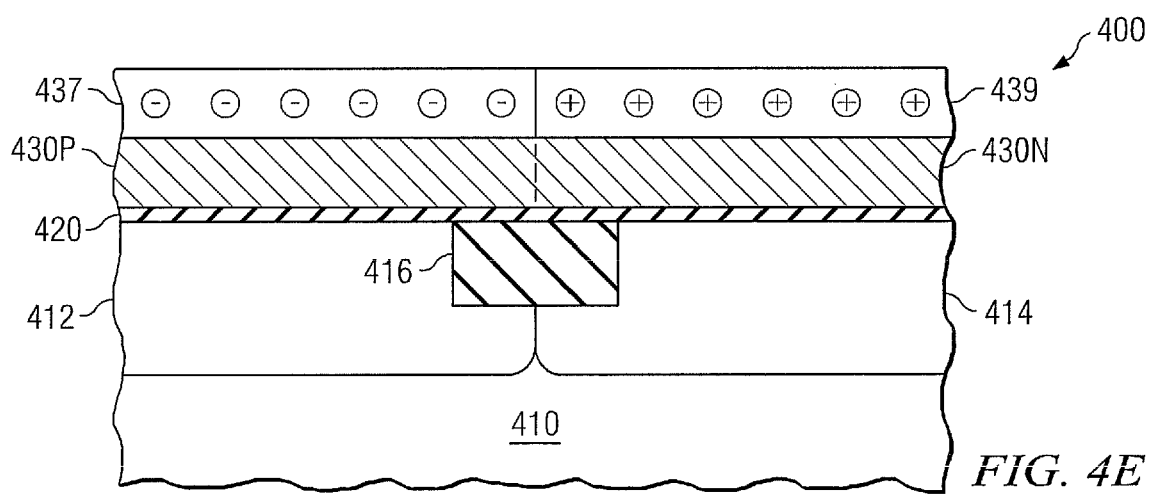

In FIG. 4E, the second selected portion 439 of the cladding layer can include the added electropositive species. The mask pattern 460 can then be removed. In this manner, the cladding layer 435 can be converted into the first selected portion 437 including the added electronegative species overlaying a first selected portion of the metal layer 430P, and the second selected portion 439 including the implanted electropositive species overlaying a second selected portion of the metal layer 430N.

Figure 4F:
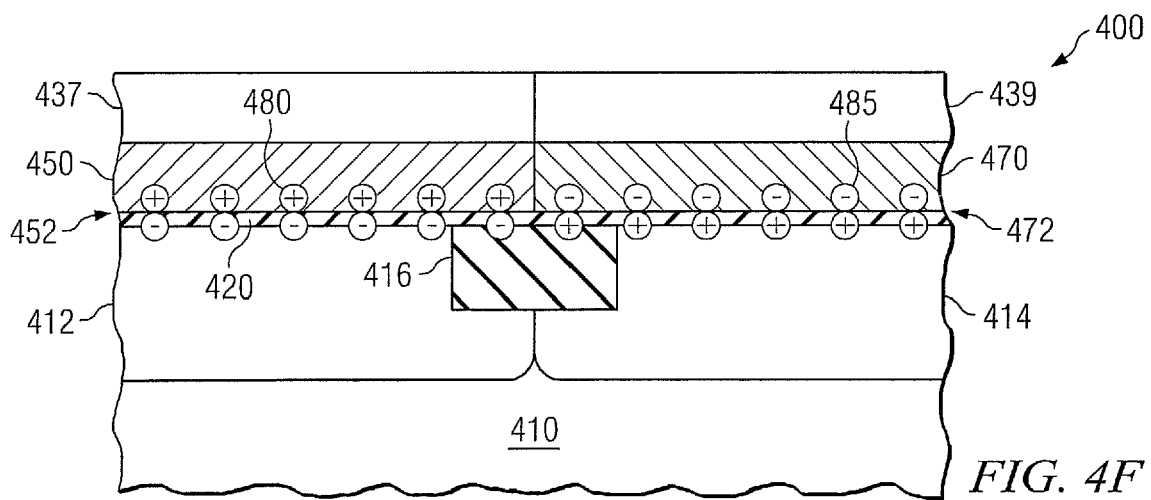

In FIG. 4F, an annealing process, for example, can be conducted to diffuse the electronegative species from the first selected portion 437 of the cladding layer to a first interface 452 between the first selected portion of the metal layer 430P and the dielectric material 420 forming a PMOS gate material 450. The annealing process can also diffuse the electropositive species from the second selected portion 439 of the cladding layer to a second interface 472 between the second selected portion of the metal layer 430N and the dielectric material 420 forming an NMOS gate material 470.

As a result, the device 400 can include a first plurality of interface dipoles 480 pointing into the PMOS gate material 450 at the interface 452. The device 400 can also include a second plurality of interface dipoles 485 pointing out of the NMOS gate material 470 at the interface 472. In various embodiments, the cladding layer including portions of 437 and 439 can be removed to expose the PMOS gate material 450 and the NMOS gate material 470.

Conventional processes can be followed to pattern and etch the device 400 shown in FIG. 4F to complete the fabrication process of the PMOS and NMOS transistors as similarly described in FIGS. 2G-2H.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A dual work function semiconductor device, comprising:
    a semiconductor substrate conductively doped to form a PMOS region and an NMOS region;
    a first patterned portion of a layer of dielectric material formed over the PMOS region;
    a first patterned portion of a layer of metal gate electrode material formed on the first patterned portion of the layer of dielectric material;
    implanted electronegative species at a metal surface of the first patterned portion of the layer of metal gate electrode material at a first interface of the first patterned portion of the layer of metal gate electrode material and the first patterned portion of the layer of dielectric material, wherein a first plurality of interface dipoles is formed at the first interface to provide the first patterned portion of the layer of metal gate electrode material with an increased work function value;
    a second patterned portion of the layer of dielectric material formed over the NMOS region;
    a second patterned portion of the layer of metal gate electrode material formed on the second patterned portion of the layer of dielectric material; and
    implanted electropositive species at a metal surface of the second patterned portion of the layer of metal gate electrode material at a second interface of the second patterned portion of the layer of metal gate electrode material and the second patterned portion of the layer of dielectric material, wherein a second plurality of interface dipoles is formed at the second interface to provide the second patterned portion of the layer of metal gate electrode material with a decreased work function value.

2. The device of claim 1, wherein the implanted electronegative species comprises one or more electronegative species selected from the group consisting of C, N, O, F, S, Cl, Se, Br, Kr, I, and Xe.

3. The device of claim 1, wherein implanted electropositive species comprises one or more electropositive species selected from the group consisting of Cs, Ba, Rb, Sr, Mg, Li, Yb, Gd, and Be.

4. The device of claim 1, wherein the first patterned portion of the metal gate electrode material has the increased work function value of about 4.8 to 5.4 eV.

5. The device of claim 1, wherein the second patterned portion of the metal gate electrode material has the decreased work function value of about 3.8 to 4.4 eV.

6. The device of claim 1, wherein the metal gate electrode material comprises one or more metals selected from the group consisting of Ti, Al, Ta, W, U, Mo, Ru, Pt, Ni, Hf, TiTa, RuTa, $TiSi_2$, WN, WCON, WAlN, WSiN TaN, TaAlN, TaCON, NiSi, $Wsi_2$, TiN, $CoSi_2$, $MoSi_2$, ZrN, WSi, HfN, $IrO_2$, PtTa, TaCN, MoN, $RuO_2$, TiAlN, TiSiN, TaSiN, TiTaN, RuTaN, PtTaN, WSiN, MoSiN, ZrSiN, HfSi, and ZrSi.

7. The device of claim 1, wherein the dielectric material comprises one or more materials selected from the group consisting of silicon oxide ($SiO_2$), silicon nitride ($Si_3N_4$), silicon oxynitride (SiON), fluorinated silicon dioxide (SiOF), silicon oxycarbide (SiOC), hafnium Oxide ($HfO_2$), hafnium-silicate (HfSiO), nitride hafnium-silicate (HfSiON), zirconium oxide ($ZrO_2$), aluminum oxide ($Al_2O_3$), barium strontium titanate (BST), lead zirconate titanate (PZT), zirconium silicate ($ZrSiO_2$), zirconium silicon oxynitride (ZrSiON), hafnium lanthanum oxynitride (HfLaON), and tantalum oxide ($TaO_2$).

8. The device of claim 1, further comprising a conductive layer over each of the first and the second patterned portions of metal gate electrode material.

9. The device of claim 2, wherein the implanted electropositive species comprises one or more electropositive species selected from the group consisting of Cs, Ba, Rb, Sr, Mg, Li, Yb, Gd, and Be.

10. The device of claim 9, wherein the first patterned portion of the metal gate electrode material has the increased work function value of about 4.8 to 5.4 eV; and wherein the second patterned portion of the metal gate electrode material has the decreased work function value of about 3.8 to 4.4 eV.

11. The device of claim 10, wherein the metal gate electrode material comprises one or more metals selected from the group consisting of Ti, Al, Ta, W, Ir, Mo, Ru, Pt, Ni, Hf, TiTa, RuTa, $TiSi_2$, WN, WCON, WAlN, WSiN TaN, TaAlN, TaCON, NiSi, $Wsi_2$, TiN, $CoSi_2$, $MoSi_2$, ZrN, WSi, HfN, $IrO_2$, PtTa, TaCN, MoN, $RuO_2$, TiAlN, TiSiN, TaSiN, TiTaN, RuTaN, PtTaN, WSiN, MoSiN, ZrSiN, HfSi, and ZrSi.

12. The device of claim 11, wherein the dielectric material comprises one or more materials selected from the group consisting of silicon oxide ($SiO_2$), silicon nitride ($Si_3N_4$), silicon oxynitride (SiON), fluorinated silicon dioxide (SiOF), silicon oxycarbide (SiOC), hafnium Oxide ($HfO_2$), hafnium-silicate (HfSiO), nitride hafnium-silicate (HfSiON), zirconium oxide ($ZrO_2$), aluminum oxide ($Al_2O_3$), barium strontium titanate (BST), lead zirconate titanate (PZT), zirconium silicate ($ZrSiO_2$), zirconium silicon oxynitride (ZrSiON), hafnium lanthanum oxynitride (HfLaON), and tantalum oxide ($TaO_2$).

13. A dual work function semiconductor device, comprising:
  a semiconductor substrate conductively doped to form a PMOS region and an NMOS region, with an isolation region separating the PMOS region and NMOS region;
  a first portion of patterned dielectric material formed over the PMOS region;
  a first portion of patterned metal gate electrode material formed on the first portion of patterned dielectric material;
  implanted electronegative species at a metal surface of the first portion of patterned metal gate electrode material at a first interface of the first portion of patterned metal gate electrode material and the first portion of patterned dielectric material, thereby forming a first plurality of interface dipoles at the first interface to provide the first portion of patterned metal gate electrode material with a first work function value;
  a second portion of patterned dielectric material formed over the NMOS region;
  a second portion of patterned metal gate electrode material formed on the second portion of patterned dielectric material; and
  implanted electropositive species at a metal surface of the second portion of patterned metal gate electrode material at a second interface of the second portion of patterned metal gate electrode material and the second portion of patterned dielectric material, thereby forming a second plurality of interface dipoles at the second interface to provide the second portion of patterned metal gate electrode material with a second work function value lower than the first work function value.

14. The device of claim 13, wherein the first portion of patterned metal gate electrode material comprises a first metal, and the second portion of patterned gate electrode material comprised a second metal different from the first metal.

15. The device of claim 14, wherein the first and second portions of patterned gate material comprise respective first and second portions of metal and respective first and second portions of cladding material.

16. The device of claim 15, wherein the electronegative species is implanted at the metal surface at the first interface by implantation into the first portion of cladding material and diffusion into the first portion of metal; and the electropositive species is implanted at the metal surface at the second interface by implantation into the second portion of cladding material and diffusion into the second portion of metal.

17. The device of claim 16, wherein the diffusions into the first and second portions of metal result from annealing.

* * * * *